(12) United States Patent
Inaba et al.

(10) Patent No.: US 7,456,481 B2
(45) Date of Patent: Nov. 25, 2008

(54) SEMICONDUCTOR DEVICE AND MANUFACTURING METHOD OF THE SAME

(75) Inventors: Satoshi Inaba, Yokohama (JP); Makoto Fujiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 11/496,452

(22) Filed: Aug. 1, 2006

(65) Prior Publication Data

US 2006/0267112 A1    Nov. 30, 2006

Related U.S. Application Data

(62) Division of application No. 10/799,780, filed on Mar. 15, 2004, now Pat. No. 7,112,858.

(30) Foreign Application Priority Data

Oct. 10, 2003    (JP)    ............... 2003-352628

(51) Int. Cl.
    *H01L 29/76* (2006.01)
(52) U.S. Cl. .................. 257/401; 257/204; 257/250; 257/E27.098; 438/284
(58) Field of Classification Search ................ 257/401, 257/E27.098
    See application file for complete search history.

(56) References Cited

U.S. PATENT DOCUMENTS

| | | | |
|---|---|---|---|
| 6,057,568 | A | 5/2000 | Kumagai |
| 6,140,687 | A | 10/2000 | Shimomura et al. |
| 6,525,403 | B2 | 2/2003 | Inaba et al. |
| 6,888,207 | B1 | 5/2005 | Hebert |

| | | | | |
|---|---|---|---|---|
| 2001/0038551 | A1* | 11/2001 | Forbes | ......................... 365/177 |

(Continued)

FOREIGN PATENT DOCUMENTS

JP    60-142567    7/1985

(Continued)

OTHER PUBLICATIONS

Yang-Kyu Choi, et al., "Sub-20nm CMOS FinFET Technologies", International Electron Devcies Meeting (IEDM) Tech. Dig., Dec. 2001, pp. 421-424.

(Continued)

*Primary Examiner*—Tu-Tu V Ho
(74) *Attorney, Agent, or Firm*—Oblon, Spivak, McClelland, Maier & Neustadt, P.C.

(57)    ABSTRACT

A semiconductor device includes a first device region including a plurality of source regions and a plurality of drain regions of first conductivity type transistors, a plurality of loop-shaped gate electrode regions of the first conductivity type transistors, a second device region including a plurality of source regions and a plurality of drain regions of a second conductivity type transistors, a plurality of loop-shaped gate electrode regions of the second conductivity type transistors, a first wiring configured to supply a first voltage to at least one of the source regions of the first device region, a second wiring configured to supply a second voltage to at least one of the source regions of the second device region, and a third wiring electrically coupled to the drain regions of the first and second device regions and to the gate electrode regions of the first and the second conductivity type transistors.

10 Claims, 14 Drawing Sheets

U.S. PATENT DOCUMENTS

2003/0178670 A1* 9/2003 Fried et al. .................. 257/315
2004/0026759 A1* 2/2004 Nakabayashi ............... 257/499

FOREIGN PATENT DOCUMENTS

| JP | 62-105426 | 5/1987 |
|----|-----------|--------|
| JP | 63-307739 | 12/1988 |
| JP | 02-201965 | 8/1990 |
| JP | 03-108329 | 5/1991 |
| JP | 03-145761 | 6/1991 |
| JP | 04-078171 | 3/1992 |
| JP | 05-021790 | 1/1993 |
| JP | 04-056361 | 2/1993 |
| JP | 05-198817 | 8/1993 |
| JP | 7-202146 | 8/1995 |
| JP | 07-263677 | 10/1995 |
| JP | 2000-174267 | 6/2000 |

OTHER PUBLICATIONS

Bin Yu, et al., "FinFET Scaling to 10nm Gate Length", International Electron Devices Meeting (IEDM) Tech. Dig., Dec. 2002, pp. 251-254.

* cited by examiner

US 7,456,481 B2

SEMICONDUCTOR DEVICE AND MANUFACTURING METHOD OF THE SAME

CROSS REFERENCE TO RELATED APPLICATIONS

This application is a Divisional of U.S. patent application Ser. No. 10/799,780, filed Mar. 15, 2004, and is based upon and claims the benefit of priority from the prior Japanese Patent Application No. P2003-352628 filed on Oct. 10, 2003. The entire contents of these applications are incorporated herein by reference.

BACKGROUND OF THE INVENTION

1. Field of the Invention

The present invention relates to a semiconductor device and a manufacturing method of the same, and particularly, to a technology employing a fine gate forming process using a sidewall pattern transfer method.

2. Description of the Related Art

In recent years, the performance of a large scale integrated circuit (LSI) formed on a silicon substrate has been significantly increased due to a finer device used for the LSI. In other words, the performance has been improved by reducing, based on a so-called scaling law, a gate length of a metal oxide semiconductor field effect transistor (MOSFET) used for a logic circuit or for a memory device such as a static random access memory (SRAM). Alternatively, the performance may have been improved by thinning a gate insulator.

Among the above, with regard to the reduction of the gate length, it has become more and more difficult to form a fine gate electrode pattern along with changes in generations. In some cases, the gate electrode has become so fine that a resolution limit of optical lithography has already been exceeded. Accordingly, it has become extremely difficult to form a thinner pattern by a conventional combination of resist coating and ultraviolet light exposure and to control a spatial fluctuation of a pattern formed by the above combination.

Therefore, in stead of directly forming a thin gate pattern by using resist, a method has been recently proposed in which: a dummy pattern is first formed; an insulator film, polysilicon, amorphous silicon or the like is deposited onto the dummy pattern; entirely perform reactive ion etching (RIE), which is also called as a sidewall leaving process, to form sidewall portions formed of the deposited film around the sidewalls of the dummy pattern; the dummy pattern is removed thereafter; and a gate electrode or a silicon substrate is processed using the thin sidewall patterns as masks.

For example, a method of processing a silicon substrate by the above method is disclosed in "p. 421, IEDM 2001 Tech. Dig., by Y, -K. Choi, et al." This method will be hereinafter referred to as a sidewall pattern transfer method. According to this method, the thin pattern formed by the sidewall leaving process is formed basically depending only on the film thickness of the deposited film and an etching condition. In addition, a thin line can be formed even if the fine gate pattern is not formed using resist. In practice, this portion requires a large pattern formation using resist because a contact region for connecting a metal wiring portion with the gate electrode is necessary. However, a thin line pattern of the gate electrode portion to be a channel portion can be formed without using lithography.

Meanwhile, a fin field effect transistor (FinFET), which is one of three dimensional MOSFETs and utilizes as channels side portions of a device region thinly cut out into oblong strips, is described in "p. 1032, IEDM 1998, by D. Hisamoto et al."

FIG. 29 shows an example of a typical layout of a complementary metal oxide semiconductor (CMOS) inverter (inverter chain) made up of conventional MOSFETs. In this CMOS inverter, a gate electrode region 201 is connected to a drain region 203 of a p-channel MOSFET (pFET), a drain region 202 of an n-channel MOSFET (nFET), and a pad region 209 of a gate electrode. A plurality of source regions 205 of the pFETs and a plurality of source regions 204 of the nFETs are arranged in parallel. Similarly, a plurality of drain regions 202 of the nFETs and a plurality of drain regions 203 of the pFETs are arranged in parallel. A metal wiring 206 supplying a power supply voltage (Vcc) is connected to the source region 205 of the pFET through a pad region 208. Moreover, a metal wiring 207 supplying a ground voltage (Vss) is connected to the source region 204 of the nFET through the pad region 208. In this way, only one gate electrode 201 is disposed in one device region. Here, the pad region 209 of the gate electrode is shared by the nFET and the pFET. It is possible to divide the gate electrode into two separate gate electrodes one of which is for the nFET and one for the pFET, and also possible to connect the separate gate electrodes with the metal wiring 206 and 207, respectively. Further, if a gate length between the adjacent MOSFETs is Lg, a device isolation width 210 is Li, a source region length (channel length direction) is Ls and a drain region length (channel length direction) is Ld, an area occupied by one CMOS inverter is proportional to Li+Ls+Ld+Lg, which determines a pitch between the inverters.

By contrast, FIG. 1 of Japanese Patent Laid-Open Hei 7-202146 (Technical Literature 1) discloses a technology in which a gate electrode encloses a region surrounding a source or drain region in order to suppress a gate resistance increase attributable to a finer gate length in a highly integrated CMOS logic LSI. Here, the gate electrode has an electrically closed loop shape.

However, the gate pattern formed by the sidewall pattern transfer method forms the sidewall portions over the entire dummy pattern. Therefore, the gate electrode here is connected to form a loop shape along the shape of the dummy pattern unlike the conventional straight gate electrode.

Therefore, the gate electrode cannot be formed using the layout of the MOSFET, where the conventional gate electrode structure is employed, as it is. If this layout should be used, a process of processing the gate electrode is further required. Paradoxically, it is clear that, if the shape of the gate electrode formed by the sidewall pattern transfer method is employed as it is, a basic logic circuit such as an inverter cannot be constituted in the layout of the conventional transistor.

SUMMARY OF THE INVENTION

An aspect of the present invention provides a semiconductor device that includes a first transistor including a source region, a drain region provided in a same device region as the source region, and a loop-shaped gate electrode region, and a second transistor sharing, with the first transistor, the loop-shaped gate electrode region and the source region or the drain region.

Another aspect of the present invention provides a semiconductor device that includes a device region where each of a plurality of source regions and each of a plurality of drain regions of transistors are alternately included, and a plurality of loop-shaped gate electrode regions of the transistors which are formed on the device region and part of which are disposed onto two positions between the source regions and the drain regions.

A further aspect of the present invention provides a semiconductor device that includes a first device region including a plurality of source regions and a plurality of drain regions of first conductivity type transistors, a plurality of loop-shaped gate electrode regions of the fist conductivity type transistors, the gate electrode regions being formed on the first device region, a second device region including a plurality of source regions and a plurality of drain regions of second conductivity type transistors, a plurality of loop-shaped gate electrode regions of the second conductivity type transistors, each of the gate electrode regions being formed on the second device region and electrically coupled to each of the gate electrode regions of the first conductivity type transistors, a first wiring configured to supply a first voltage to at least one of the source regions of the first device region, a second wiring configured to supply a second voltage to at least one of the source regions of the second device region, and a third wiring electrically coupled to the drain regions of the first and second device regions and to the gate electrode regions of the first and second conductivity type transistors.

An aspect of the present invention provides a manufacturing method of a semiconductor device that includes depositing a hard mask material on a gate electrode material, forming a dummy gate pattern on the deposited hard mask material, depositing a material for forming a sidewall around the dummy gate pattern, etching the material for forming the sidewall while the sidewall is left, selectively removing the dummy gate pattern, depositing resist, by lithography, to form a region coupling a gate electrode with a metal wiring, processing a hard mask of a gate electrode region, removing the resist, and processing the gate electrode region using the hard mask.

Here, a first conductivity type and a second conductivity type are opposite to each other. In other words, if the first conductivity type is an n-type, the second conductivity type is a p-type, and if the first conductivity type is a p-type, the second conductivity type is an n-type.

DETAILED DESCRIPTION OF EMBODIMENTS

Figure 1:
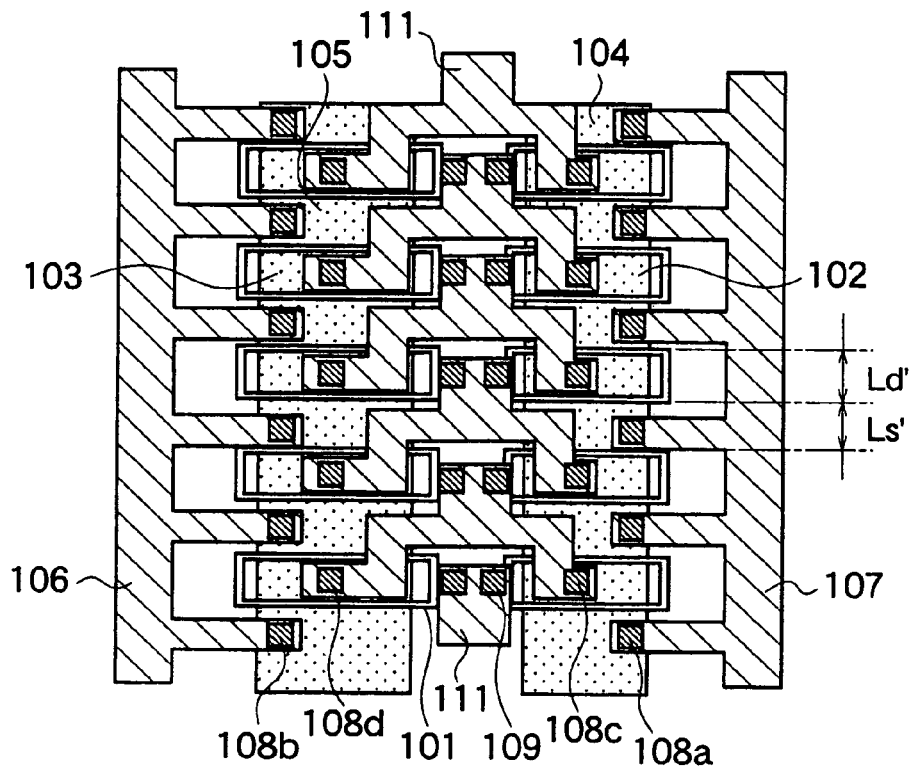
FIG. 1 is a view showing a layout of a semiconductor device according to a first embodiment.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

FIG. 1 is a view showing a layout of a semiconductor device according to a first embodiment. In this semiconductor device, two device regions (dotted regions in the drawing) are respectively formed, and gate electrode regions 101 are provided thereon. The device regions 102 and 103 surrounded by the gate electrode regions 101 form a drain region 102 of an nFET and a drain region 103 of a pFET, respectively. Furthermore, the respective device regions not surrounded by the gate electrode regions 101 form source regions. Specifically, a region 104 which is the device region not surrounded by the gate electrode region 101 forms a source region 104 of the nFET, while a region 105 which is the device region not surrounded by the gate electrode region 101 forms a source region 105 of the pFET. The source region 104 of the nFET is coupled to a ground wiring 107 through a contact region 108a. The source region 105 of the pFET is coupled to a power supply wiring 106 through a contact region 108b. A plurality of wirings 111 disposed in the center of the drawing are coupled to the drain regions 102 of the nFETs through contact regions 108c and to the drain regions 103 of the pFETs through contact regions 108d. In addition, the wirings 111 are coupled to the gate electrode regions 101 through pads 109.

Thus, in the semiconductor device of the present embodiment, the gate electrode region 101 is formed by the sidewall pattern transfer method. Therefore, the gate electrode region 101 is formed in a loop shape. Moreover, the pad 109 is disposed onto part of the loop-shaped gate region as a connection region to connect the gate region with the metal wiring. Additionally, inverter chains are formed in the semiconductor device of this embodiment. As a consequence, each inverter shares the source region 104 or 105 with the inverter in the next stage.

Since the semiconductor device has such a structure, if the area of the drain region is the same as that of a conventional type, an electric current to drive junction capacitance per unit area is twice as large as that of a conventional MOSFET. Therefore, switching delay time can be improved. Moreover, since a mechanical strength of the gate can be improved by forming the gate in a loop-shape, the pattern of the ultra-fine gate region 101 can be prevented from falling down. Furthermore, since two gate electrodes are connected in parallel, parasitic resistance of the gate electrodes can be reduced. In addition, a MOSFET suitable to a gate electrode forming process employing the sidewall pattern transfer method can be formed using the loop-shaped gate electrode.

In this way, the drain region is formed inside the region surrounded by the gate electrode region connected in a loop-shape. That is, the drain region is formed inside the loop-shaped gate electrode. Thus, contribution of the junction capacitance can be seemingly reduced, which contributes to speeding-up of the semiconductor device.

Here, the configuration of the loop-shaped gate electrode region forming the nFET and that of the loop-shaped electrode region forming the pFET, as well as the configuration of the device region of the nFET and that of the device region of the pFET may be asymmetrical to each other, respectively. When the asymmetrical gate and device configurations are employed, a ratio between effective channel widths of the nFET and pFET can be adjusted.

Meanwhile, the source region is formed outside the region surrounded by the gate electrode region connected in the loop-shape. That is, the source region is arranged outside the gate electrode. Thus, a structure where an electric current as large as that of an ordinary MOSFET is applied is available. Alternatively, a structure where an electric current twice as large as that of the ordinary MOSFET is applied to the drain per unit area is available.

The regions connected in the loop-shapes that are the gate electrode regions may be formed so that the lengths thereof are the same on the device regions and a device isolation region.

Moreover, the gate electrode region of the pFET and that of the nFET may be coupled to each other through a region made of a same material as one forming these regions. Examples of the material include polysilicon and self-aligned silicide (salicide).

Furthermore, the substrate of the semiconductor device of the present invention may be a bulk substrate or a silicon-on-insulator (SOI) substrate.

Figure 29:
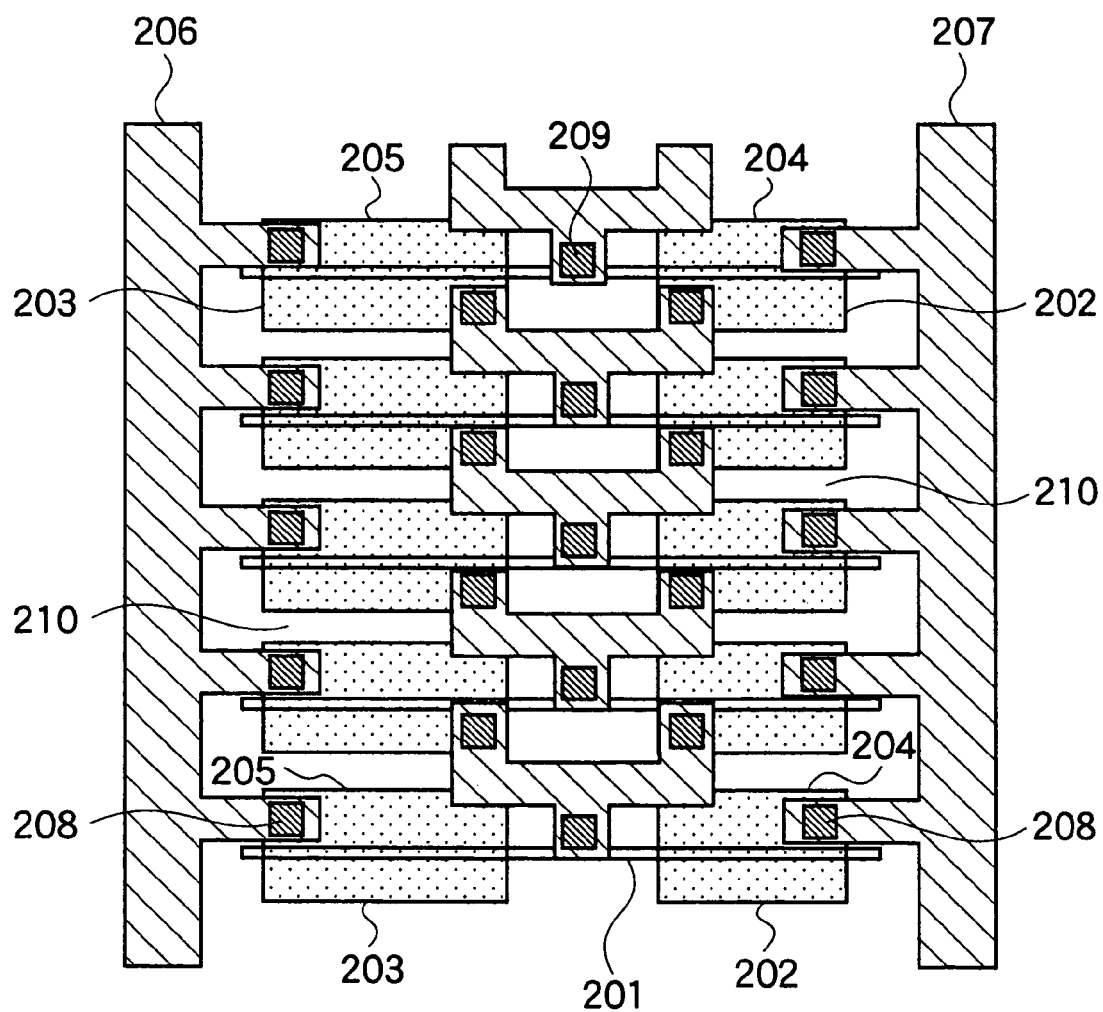
FIG. 29 shows an example of a typical layout of a complementary metal oxide semiconductor inverter chain made up of conventional MOSFETs.

In the case of the inverter chains of FIG. 1, a region corresponding to the device isolation region 210 of FIG. 29 illustrating a conventional technology can be omitted. Therefore, if a source region length (channel length direction) is Ls' and a drain region length (channel length direction) is Ld', the area occupied by one CMOS inverter is proportional to Ls'/2+Ls'/2+Ld'=Ls'+Ld'. Accordingly, depending on a design rule, even when an inequality Ls<Ls' or Ld<Ld' is true, the layout can be one where an area equivalent to the device isolation region is reduced. This also contributes to higher integration of the semiconductor device.

Moreover, in the technology described in Technical Literature 1, one closed loop gate region serves as one gate. Specifically, in FIG. 1 of the foregoing Technical Literature 1, only one line of one closed loop becomes a gate. The present embodiment is different in that two lines of one closed loop serve as the gates. Therefore, there is an effect that the layout area can be made smaller.

Figure 2:
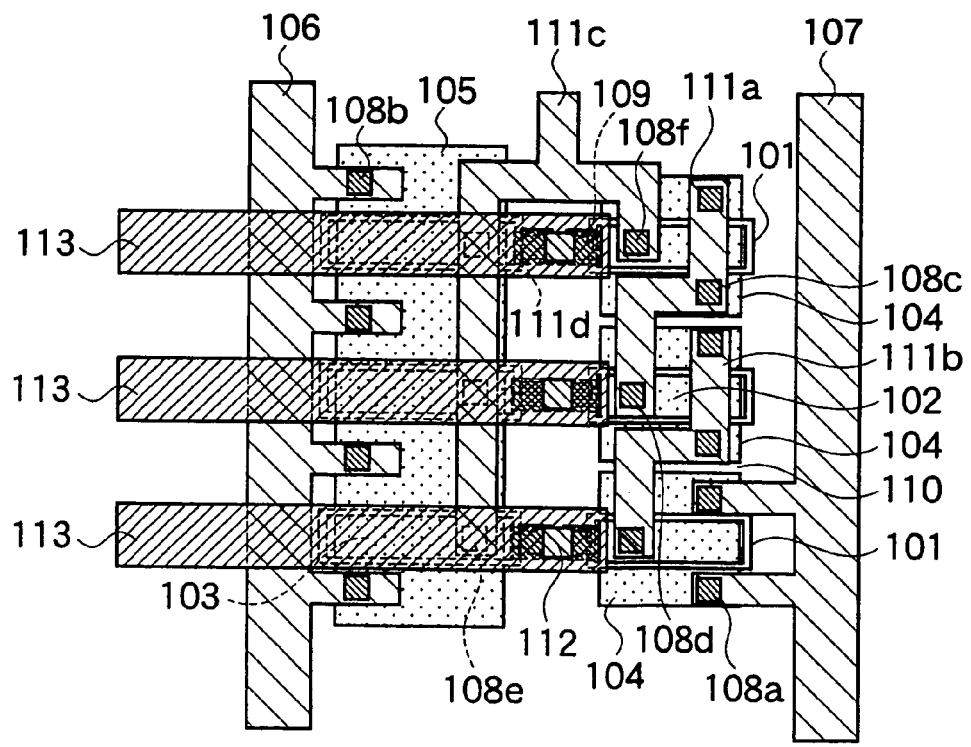
FIG. 2 is a view showing a layout of a semiconductor device according to a second embodiment.

FIG. 2 is a view showing a layout of a semiconductor device according to a second embodiment. The layout shown by the second embodiment is a layout of a three-way NAND gate. In this semiconductor device, a plurality of device regions 104 are formed on the right side of the drawing and a device region 105 is formed on the left side thereof. A plurality of gate electrode regions 101 are provided on these device regions. The device regions 102 and 103 surrounded by the gate electrode regions 101 form a drain region 102 of the nFET and a drain region 103 of the pFET, respectively. In addition, each of regions that are device regions not surrounded by the gate electrode regions 101 forms a source region. Specifically, the region 104 not surrounded by the gate electrode region 101 forms the source region 104 of the nFET, and the region 105 not surrounded by the gate electrode region 101 forms the source region 105 of the pFET.

The source regions 104 of the nFET are coupled to a ground wiring 107 through contact regions 108a. Further, the source regions 105 of the pFETs are respectively coupled to a power supply wiring 106 through contact regions 108b. Wirings 111a and 111b are coupled to the source regions 104 of the nFETs through contact regions 108c, and coupled to the drain regions 102 of the nFETs through contact regions 108d. Moreover, a wiring 111c is coupled to three drain regions of the pFETs through contact regions 108e, and coupled to the drain region 102 of the nFET through a contact region 108f. A plurality of wirings 111d connecting the gate electrode regions of the pFETs with the gate electrode regions of the nFETs are coupled to the gate electrode regions 101 through pads 109. Three wiring regions 113 are coupled to the wirings 111d through via regions 112.

In the three-way NAND gate circuit, the adjacent nFETs are connected in series and the adjacent pFETs are connected in parallel. In FIG. 2, the source regions 105 of the pFETs between the adjacent pFETs are connected and shared therebetween. However, the source regions 105 can be separated to be two adjacent regions with a device isolation region interposed therebetween. Moreover, as for the nFET, due to the circuit configuration, MOSFETs are not connected and each of which has two source regions 104 and one drain region 102.

Here, a metal wiring layer other than the ones coupled to the drains may be disposed above the drain regions. Thus, a wiring against the gate electrode can be laid above the drain regions, whereby gate resistance can be reduced.

An input to the three-way NAND gate is coupled to the gate electrode 101 through the wiring 113 which is a wiring of a second layer, the via region 112, the wiring 111d which is a first metal wiring layer, and the pad 109. Further, in this case, an output from a drain electrode region of the nFET is inputted to two points in the source region of the nFET in the next stage. Moreover, a NOR-type logic gate circuit can be formed by switching the nFET with pFET based on the layout of FIG. 2. Therefore, it is possible to form a gate electrode using the sidewall pattern transfer technology even in the NOR circuit.

Figure 3:
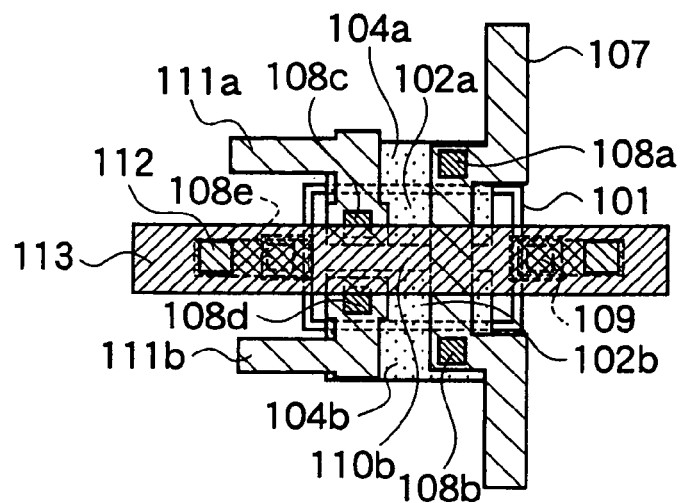
FIG. 3 is a view showing a layout of a semiconductor device according to a third embodiment.

FIG. 3 is a view showing a layout of a semiconductor device according to a third embodiment. Specifically, this drawing shows a layout of pair MOSFET devices of a common gate used for some of current mirror-type differential amplifiers or the like. In this embodiment, a plurality of device regions surrounded by a gate region 101 are separately disposed. The device regions 102a and 102b surrounded by the gate electrode region 101 form drain regions 102a and 102b of the nFET. On the other hand, regions not surrounded by the gate electrode region 101 form source regions 104a and 104b of the nFET. The source regions 104a and 104b of the nFET are coupled to a ground wiring 107 through contact regions 108a and 108b. Moreover, wirings 111a and 111b are coupled to the drain regions 102a and 102b of the nFET through contact regions 108c and 108d, respectively. A wiring 113 is coupled to the gate electrode region 101 through a pad 109.

Thus, this semiconductor device includes two drain regions 102 separated inside the loop-shaped gate electrode region 101. These drain regions 102 are coupled to respective different output terminals. The source regions 104 may have a common electric potential or have respective different electric potentials. The electric potential can be changed by changing a way of connecting the metal wiring 107. In this way, a fine gate length with which a gate electrode can be created by sidewall pattern transfer can be realized.

Figure 4:
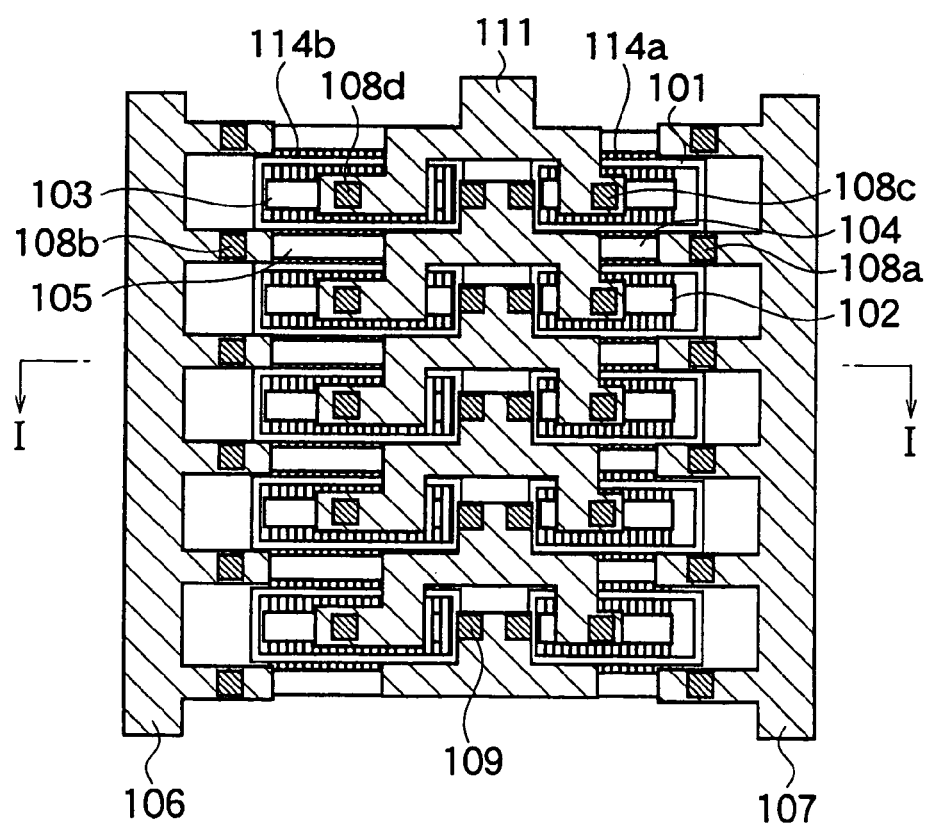
FIG. 4 is a view showing a semiconductor device of a fourth embodiment, and specifically, a CMOS inverter layout using a FinFET.

FIG. 4 is a view showing a semiconductor device of a fourth embodiment, and specifically, a CMOS inverter layout using a FinFET. The FinFET is one of three dimensional MOSFETs and utilizes as a channel side portion of a device region thinly cut out into oblong strips.

In this semiconductor device, a plurality of device regions 114a and 114b each of which includes a plurality of rectangular strip Fins are respectively formed. Gate electrode regions 101 are provided on these device regions. Device regions 102 and 103 surrounded by the gate electrode regions 101 form a drain region 102 of the nFET and a drain region 103 of the pFET, respectively. Further, regions 104 and 105 not surrounded by the gate electrode regions 101 form a source region 104 of the nFET and a source region 105 of the pFET, respectively. The source region 104 of the nFET is coupled to a ground wiring 107 through a contact region 108a, while the source region 105 of the pFET is coupled to a power supply wiring 106 through a contact region 108b. A wiring 111 is coupled to the drain region 102 of the nFET through a contact region 108c and to the drain region 103 of the pFET through a contact region 108d. Moreover, the wiring 111 is coupled to the gate electrode region 101 through a pad 109.

As shown above, in the semiconductor device of the present embodiment, a plurality of device regions each including rectangular strip Fins are provided. Thus, the channel region of the device is formed in a plane perpendicular to a substrate, and a flowing direction of an electric current is horizontal to the substrate.

Here, when processing the substrate, a height at which the substrate is cut out may be limited due to a restriction on a process such as RIE. The height is typically on the order of several tens nm to 1 μm or less. However, a height outside the above range may be adopted. To obtain an electric current sufficient to drive an external load, it is preferable to form channel regions constituted of a plurality of Fins.

Meanwhile, in the device regions, it is preferable to provide relatively wide active regions in portions other than the channel portions in order to leave spaces for the contact regions. Thus, by adopting the layout shown in FIG. 4, a logic circuit can be formed by using the sidewall pattern transfer method even when the FinFET is employed. The sidewall pattern transfer technology is also used when forming the Fin of the FinFET. Hence, ultra-fine Fin is formed. It is clear that this kind of layout is preferable to reduce drain junction capacitance of the relatively wide active regions as in the case of FIG. 1.

Here, a single source region, a single drain region and a plurality of channel regions formed in a plane perpendicular to the substrate may be formed, a flowing direction of an electric current is horizontal to the substrate, and the channel regions may be depleted during operation.

Further, a ratio β of effective channel widths of the nFET and pFET (=Wp/Wn) can be changed by changing the number of Fins in the case of FinFET. That is:

$Wp$=(height of Fin)*2*(number of Fins of pFET)

$Wn$=(height of Fin)*2*(number of Fins of nFET)

Here, if the heights of the Fins are the same, the ratio of the effective channel widths will be a ratio of the number of Fins of the pFET to the number of the Fins of the nFET.

As a result, since a β value suitable to an inverter and a β value suitable to a later-described NAND gate or the like are different, it is required to make a layout where the numbers of Fins are different according to circuits therein.

Here, a dummy Fin that is not intended to be used may be formed in view of uniformity in a lithography process and in an RIE process. Specifically, when forming a Fin, on both sides of the Fin to be used, one or several Fins having a similar shape to the Fin to be used are formed. In this way, the foregoing uniformity in the lithography and RIE processes can be realized. Moreover, damage to the devices attributable to excessive polishing during chemical mechanical polishing (CMP) can be born by the dummy Fins formed on both sides of the Fin actually used. Thus, the damage to the Fin due to the excessive polishing can be prevented.

Figure 5:
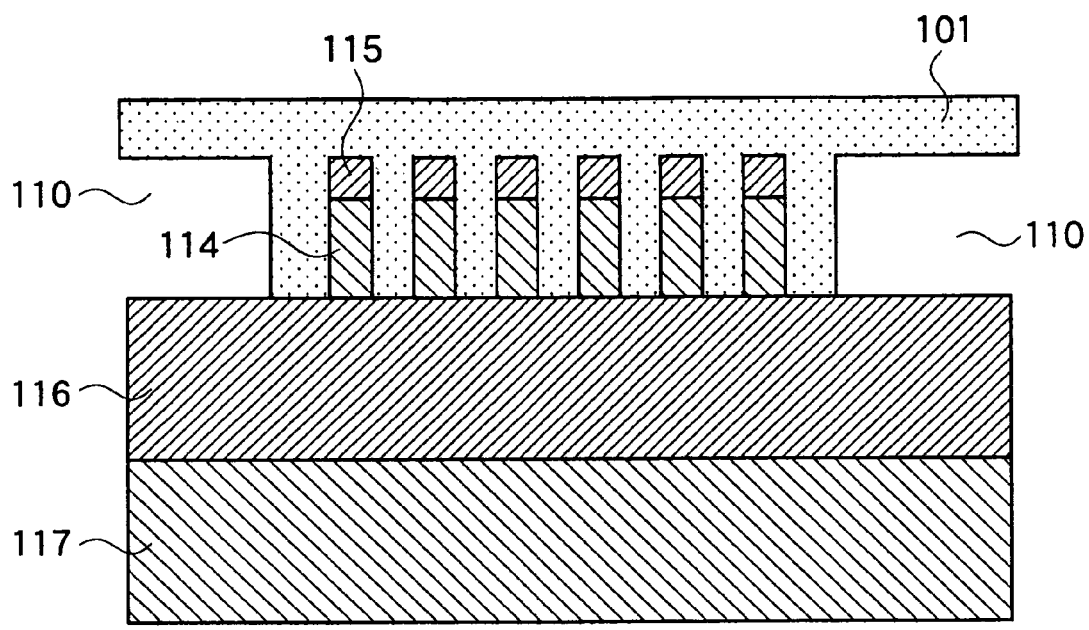
FIG. 5 is a view showing a cross-section of the nFET or pFET in a I-I section of FIG. 4.

FIG. 5 is a view showing a cross-section of the nFET or pFET in a I-I section of FIG. 4. This semiconductor device includes a buried oxide (BOX) region 116 on a substrate region 117 and a plurality of Fin regions 114 on the buried oxide region 116. A cap insulator film region 115 is provided on each of the Fin region to insulate the top surface of the Fin region. In addition, the gate electrode region 101 is provided to cover the Fin regions 114 and the cap insulator film regions 115. A predetermined region between the buried oxide region 116 and the gate electrode region 101 is provided as a device isolation region 110 that isolates the buried oxide region 116 from the gate electrode region 101.

In this manner, a structure where channels are formed only in a plane perpendicular to the substrate and not on the top surfaces of the Fins can be made in the case of the FinFET. Thus, a so-called double-gate MOSFET device, which has an immunity for the short channel effect, can be formed. In this case, in the gate electrode region, the channels are formed in the plane perpendicular to the substrate. Further, in a region sandwiched between the device isolation regions, the channel portions and the gate electrode regions are alternately formed. A wide connection portion to connect the metal wiring portion with the source and drain regions with respect to each Fin of the FinFET makes a large region, and no device isolation region is formed therein. Moreover, the pad portion of the gate electrode portion is formed on the device isolation region.

Figure 6:
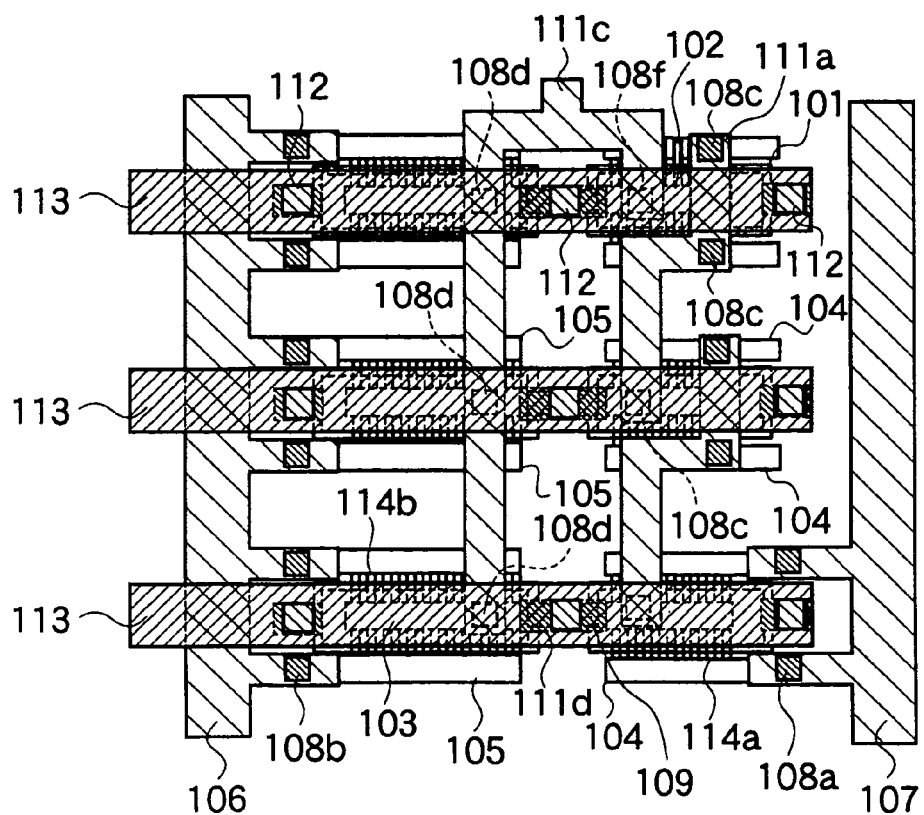
FIG. 6 is a view showing a layout of a semiconductor device of a fifth embodiment, and is a layout where the three-way NAND gate is formed by using FinFET.

FIG. 6 is a view showing a layout of a semiconductor device of a fifth embodiment, and is a layout where the three-way NAND gate is formed by using FinFET.

In this semiconductor device, device regions 114a and 114b each of which includes a plurality of rectangular strip Fins are respectively formed. Gate electrode regions 101 are provided on these device regions. Device regions 102 and 103 surrounded by the gate electrode regions 101 form a drain region 102 of the nFET and a drain region 103 of the pFET, respectively. In addition, each device region not surrounded by the gate electrode region 101 forms a source region. Specifically, regions 104 and 105 not surrounded by the gate electrode regions 101 form a source region 104 of the nFET and a source region 105 of the pFET, respectively. Three sets of the above formations are provided.

Two of the source regions 104 of the nFET are coupled to a ground wiring 107 through contact regions 108a. Moreover, the source regions 105 of the pFET are respectively coupled to a power supply wiring 106 through contact regions 108b. Wirings 111a and 111b are coupled to the source regions 104 of the nFETs through contact regions 108c and to the drain regions 102 of the nFETs through contact regions 108d. A wiring 111c is coupled to the three drain regions 103 of the pFETs through pads 109 and to the drain region 102 of the nFET through a contact region 108f. Moreover, a plurality of wirings 111d connecting the gate electrode regions of the pFETs with the gate electrode regions of the nFETs are coupled to the gate electrode regions 101 through the pads 109. Three wiring regions 113 are coupled to the wirings 111d through via regions 112 to be coupled to the gate electrode regions 101. In this embodiment, a plurality of the via regions 112 are provided. Further, each of the three wiring regions 113 is coupled to the wiring 1oll through the two via regions 112.

In the case of this embodiment, the wiring regions 113 are coupled to the gate electrodes 101 at a plurality of points through the via regions 112 and the contact regions. Therefore, parasitic resistance of the gate electrode can be reduced, whereby switching delay time is improved. Moreover, in this embodiment, the wiring regions 113 are placed on top of the drain regions. Accordingly, a plurality of contact regions coupled to the gate electrodes can be provided with almost no increase in the layout area. As a consequence, lower resistance can be achieved. In addition, the adjacent source regions of the pFETs can be made into one region to be shared as in the case of the NAND gate circuit in FIG. 3, whereby the device isolation region can be omitted. Furthermore, a similar layout to the one in FIG. 6 described in this embodiment can be applied to a NOR circuit where the nFET and pFET of FIG. 6 are switched.

Manufacturing Method of A Semiconductor Device

Next, a manufacturing method of a semiconductor device according to an embodiment will be described with reference to the drawings. In this embodiment, one example of manufacturing method of a CMOS, which has the layout of the semiconductor device described in detail in FIG. 1, will be described in order.

Figure 7:
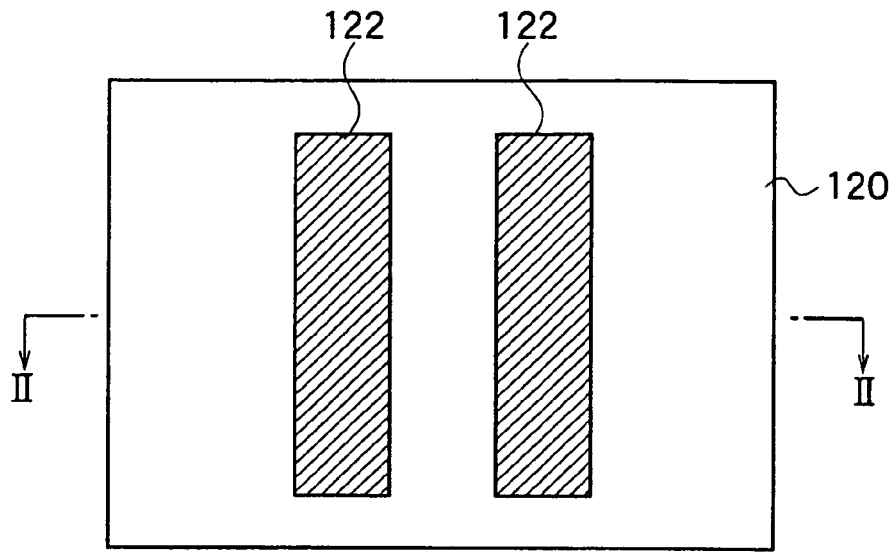
FIG. 7 is a top view for describing that device regions are formed on the upper side of a device isolation region.

FIG. 7 is a view for describing that device regions are formed on the upper side of a device isolation region. First, device regions 122 are formed on the upper side of a device isolation region 120. In this embodiment, two device regions are formed. Then, gate oxide film (not shown) is formed on the top surfaces of the device regions.

Figure 8:
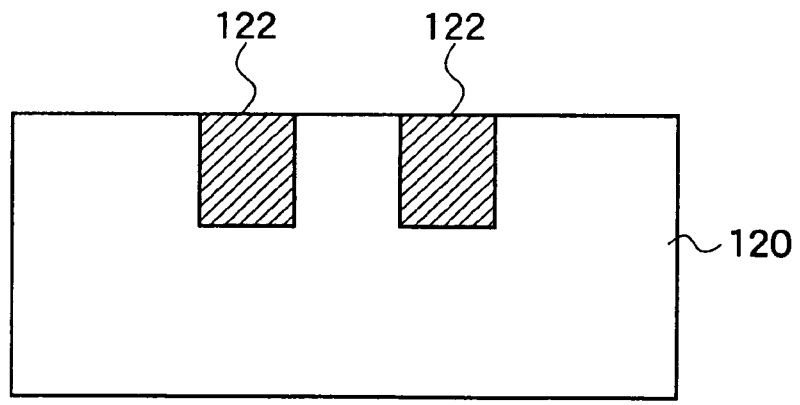
FIG. 8 is a view showing a cross-section in a II-II section of FIG. 7.

FIG. 8 is a view showing a cross-section in a II-II section of FIG. 7. As shown in the drawing, the device regions 122 are formed on the upper side of the device isolation region 120.

Figure 9:
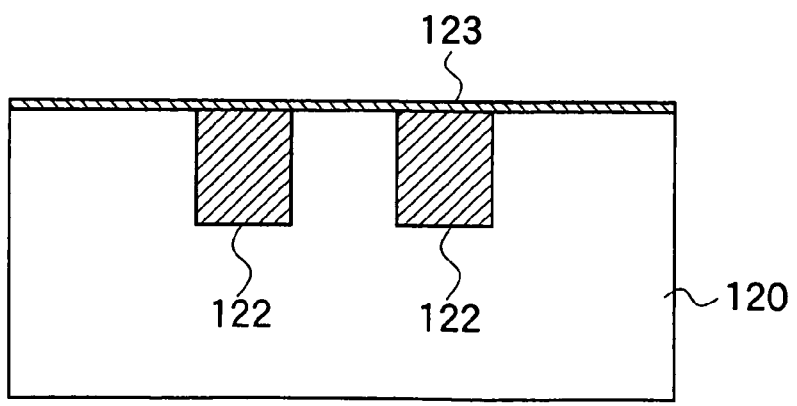
FIG. 9 is a sectional view where a gate insulator 123 is formed on top of the cross-section in the II-II section shown in FIG. 7.

FIG. 9 is a sectional view where a gate insulator 123 is formed on top of the cross-section in the II-II section shown in FIG. 7. As shown in the drawing, the gate insulator 123 is formed on the top surfaces of the device regions 122. Here, the gate insulator includes a gate oxide film (for example, $SiO_2$) and a high-dielectric-constant film. However, if chemical vapor deposition (CVD) is employed to form the high-dielectric-constant film, the gate insulator will be formed also on the sidewalls of the silicon nitride films 122.

Figure 10:
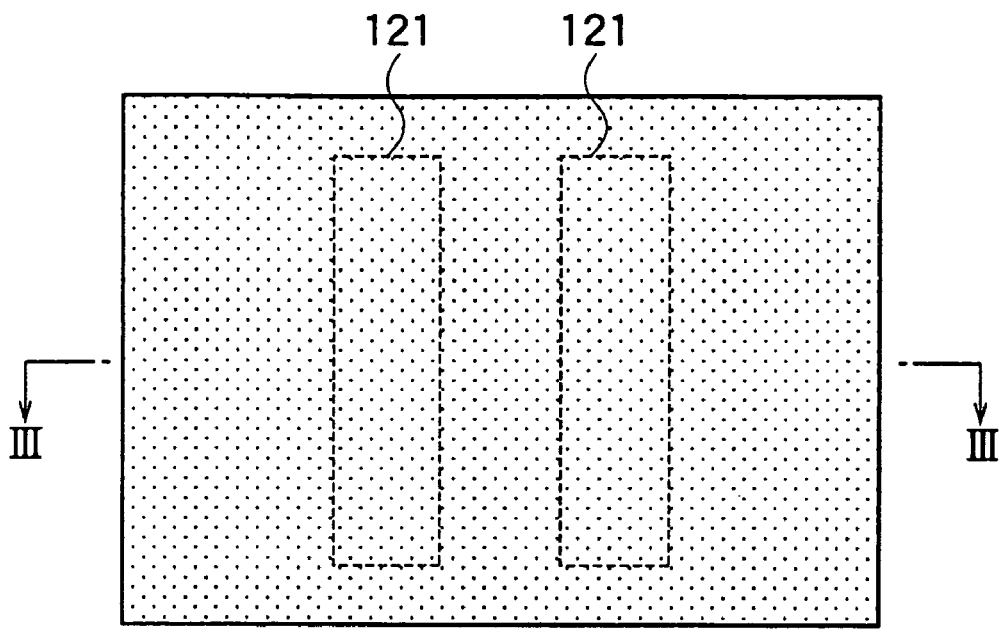
FIG. 10 is a top view where polysilicon film is formed on the upper side of the device isolation region 120.

FIG. 10 is a view where polysilicon film is formed on the upper side of the device isolation region 120. The gate insulator (not shown) is formed on top of the device isolation region 120 where the device regions 122 are formed. Thereafter, a polysilicon film 124 to serve as a gate electrode is formed. Here, a material used for the polysilicon film 124 includes polysilicon germanium, a stacked structure of polysilicon and polysilicon germanium or the like.

Figure 11:
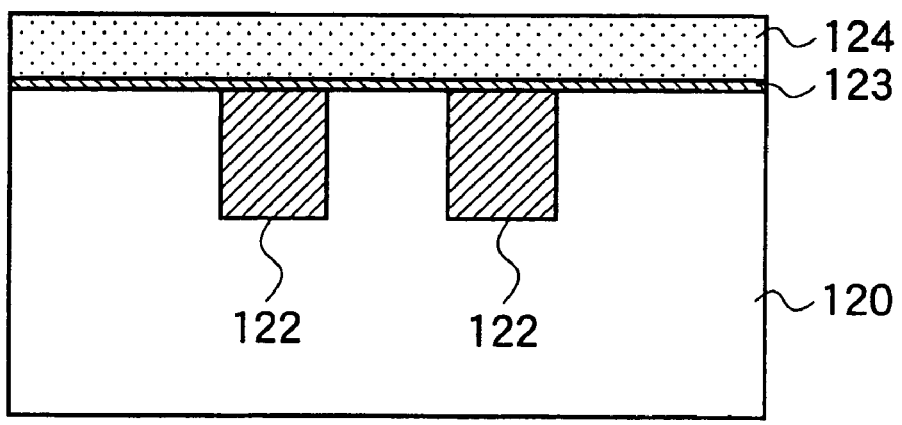
FIG. 11 is a view showing a cross-section in a III-III section of FIG. 10.

FIG. 11 is a view showing a cross-section in a III-III section of FIG. 10. As shown in the drawing, the device regions 122 are formed on the upper side of the device isolation region 120, and the gate insulator 123 is formed on the top surfaces of the device regions 122. On top of that, the polysilicon film 124 to be gate electrode is then formed. In this drawing, the upper surface of the polysilicon film 124 is flat. However, the film may not be flat like this in an actual case. Here, the polysilicon film 124 is shown as a flat film for convenience of illustration.

Figure 12:
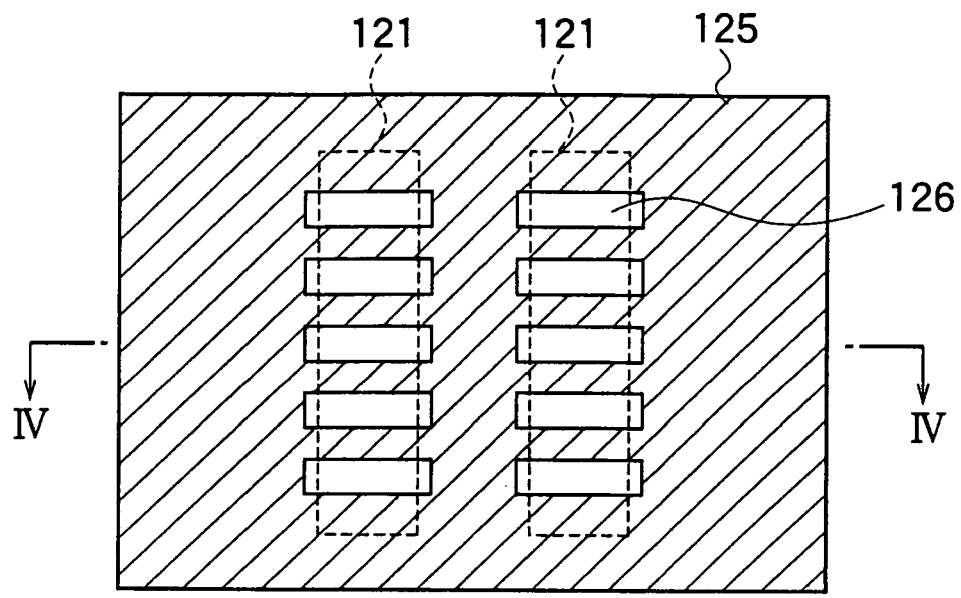
FIG. 12 is a top view where dummy patterns are formed after a film to be a material for a hard mask is formed.

FIG. 12 is a top view where dummy patterns are formed after a film to be a material for a hard mask is formed. In this process, onto the polysilicon film (not shown), the hard mask material 125 and also a material 126 having a high etching selective ratio relative to the hard mask material are sequentially deposited. Here, a stacked layer structure of $SiO_2$ and SiN can be adopted for the hard mask material. Moreover, tetraethyl orthosilicate tetraethoxysilane (TEOS) can be used for the hard mask material and material having the high selective etching ratio relative to the hard mask material. Thereafter, the dummy patterns 126 are formed by patterning the TEOS layer by lithography.

Figure 13:
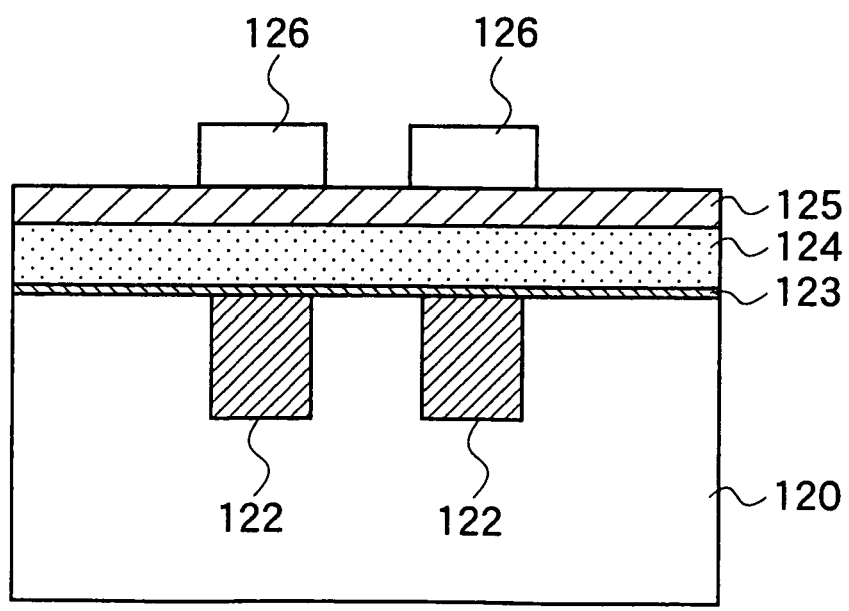
FIG. 13 is a view showing a cross-section in a IV-IV section of FIG. 12.

FIG. 13 is a view showing a cross-section in a IV-IV section of FIG. 12. As shown in the drawing, the hard mask material 125 and also the material having the high selective etching ratio relative to the hard mask material are sequentially deposited onto the polysilicon film 124. Then, the dummy patterns 126 are formed by patterning.

Figure 14:
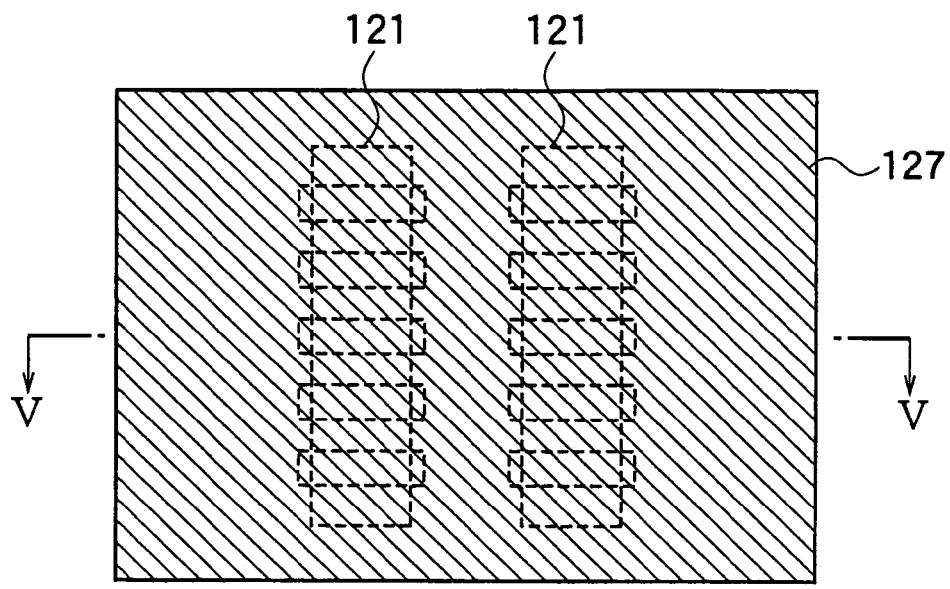
FIG. 14 is a top view where a film made of a material to form sidewalls around the dummy patterns is formed.

FIG. 14 is a top view where a film made of a material to form sidewalls around the dummy patterns is formed. In this process, after the dummy patterns are formed, the film of the material 127 to form the sidewalls around the dummy patterns is formed. Here, for example, amorphous silicon can be used for the material 127.

Figure 15:
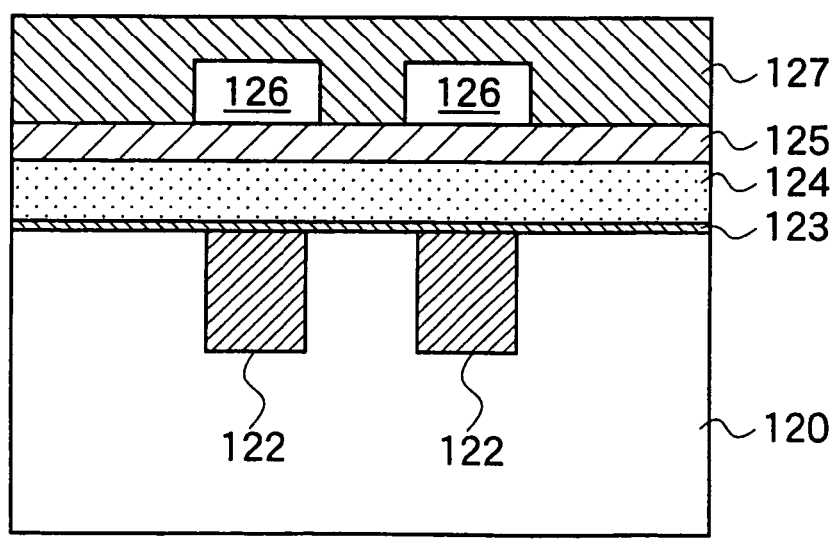
FIG. 15 is a view showing a cross-section in a V-V section of FIG. 14.

FIG. 15 is a view showing a cross-section in a V-V section of FIG. 14. As shown in the drawing, after the dummy patterns 126 are formed, the film made of the material 127 to form the sidewalls around the dummy patterns 126 is formed.

Figure 16:
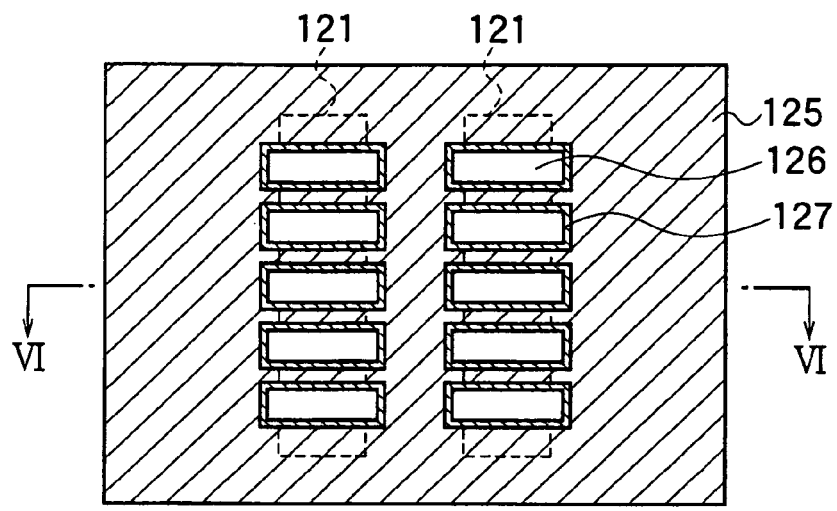
FIG. 16 is a top view where RIE is performed while the sidewalls of the dummy patterns are left.

FIG. 16 is a top view where RIE is performed while the sidewalls of the dummy patterns are left. In this process, RIE is performed to the material 127 with the sidewalls left, whereby the amorphous silicon sidewalls are formed around the dummy patterns 126.

Figure 17:
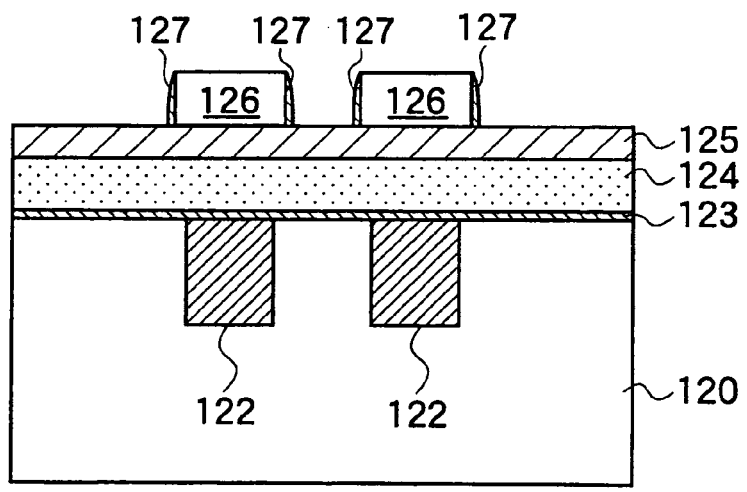
FIG. 17 is a view showing a cross-section in a VI-VI section of FIG. 16.

FIG. 17 is a view showing a cross-section in a VI-VI section of FIG. 16. As shown in the drawing, the sidewall materials 127 are formed on the sidewalls of the dummy patterns 126.

Figure 18:
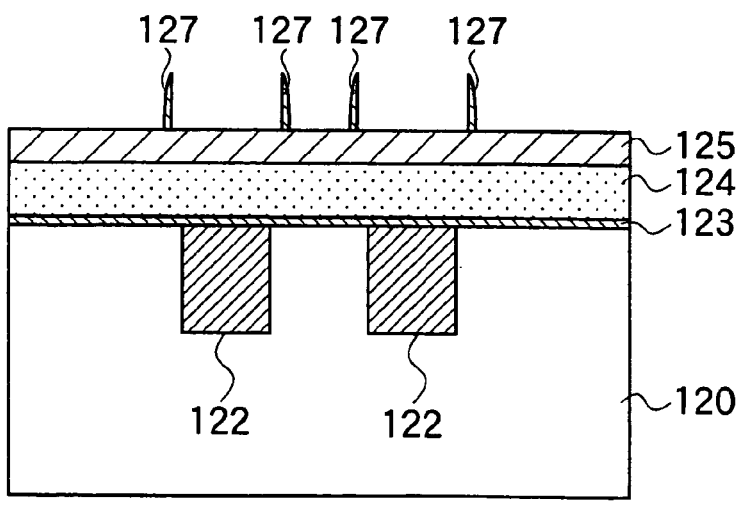
FIG. 18 is a sectional view where the dummy patterns 126 are removed from the cross-section in the VI-VI section of FIG. 16.

FIG. 18 is a sectional view where the dummy patterns 126 are removed from the cross-section in the VI-VI section of FIG. 16. As shown in the drawing, regions that have been dummy patterns 126 are removed by selective etching, and the materials 127 provided as the sidewalls are left.

Figure 19:
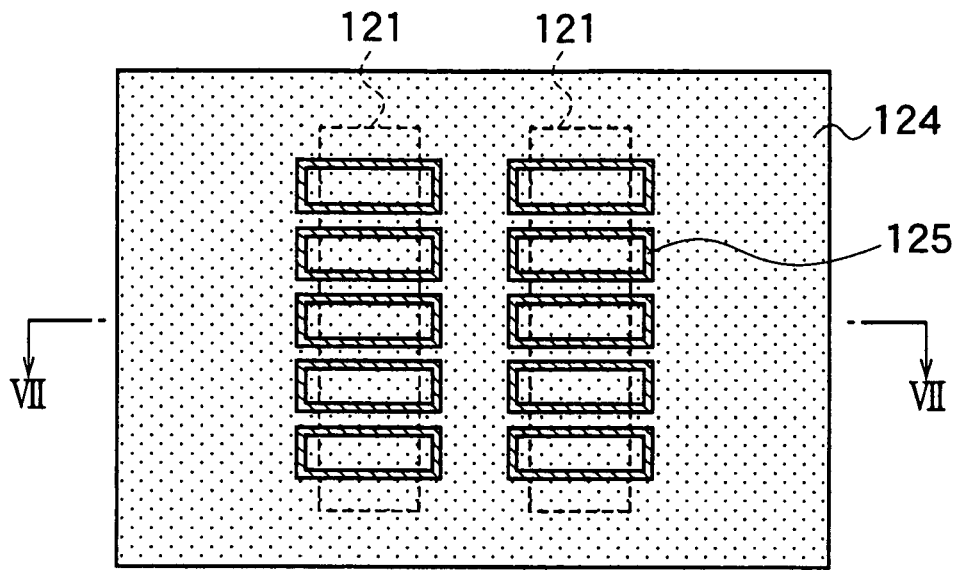
FIG. 19 is a top view where a resist pattern is formed.

FIG. 19 is a top view where a resist pattern is formed. In this process, the TEOS regions which have been the dummy patterns are selectively etched. Then, the left amorphous sidewall regions 127 are used as masks to transfer patterns to the SiN hard mask. Here, the mask material is processed by RIE.

Figure 20:
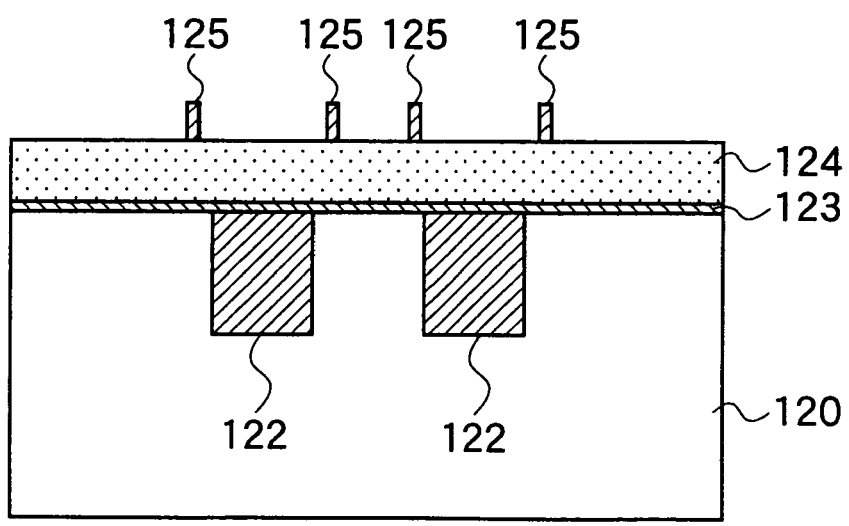
FIG. 20 is a view showing a cross-section in a VII-VII section of FIG. 19.

FIG. 20 is a view showing a cross-section in a VII-VII section of FIG. 19. As shown in the drawing, the materials 125 are left at predetermined portions by a patterning process using the sidewall materials 127 as masks. If a fine line gate electrode is required, a process to reduce the dimension of the material 125 can be added.

Figure 21:
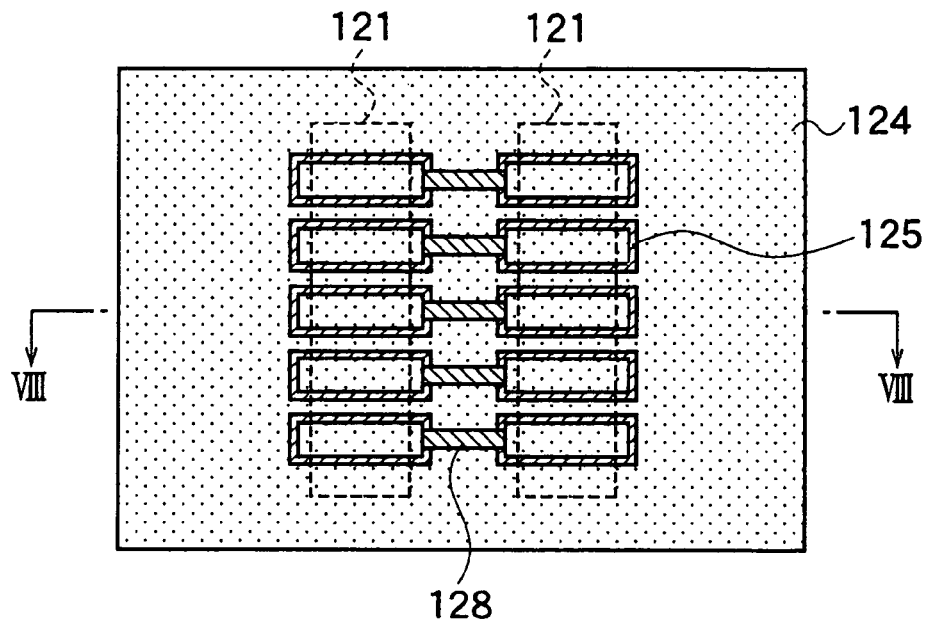
FIG. 21 is a top view where resist patterns are formed.

FIG. 21 is a top view where resist patterns are formed. In this process, portions to be the contact regions of the gate electrodes are patterned using the resist.

Figure 22:
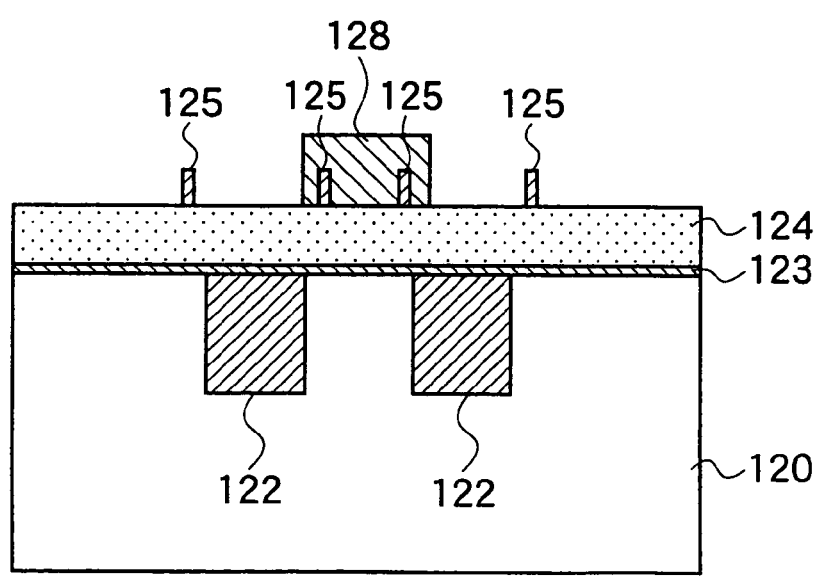
FIG. 22 is a view showing a cross-section in a VIII-VIII section of FIG. 21.

FIG. 22 is a view showing a cross-section in a VIII-VIII section of FIG. 21. Since part of the hard mask patterns of the gate electrodes need to contact with the contact regions of the gate electrodes, the part are to be covered by the resist regions 128. In this example, each of the contact regions 128 simultaneously covers the gate electrodes on the left and right sides thereof. However, the contact region 128 may be provided to each of the gate electrodes and later connected with each other by the metal wirings.

Figure 23:
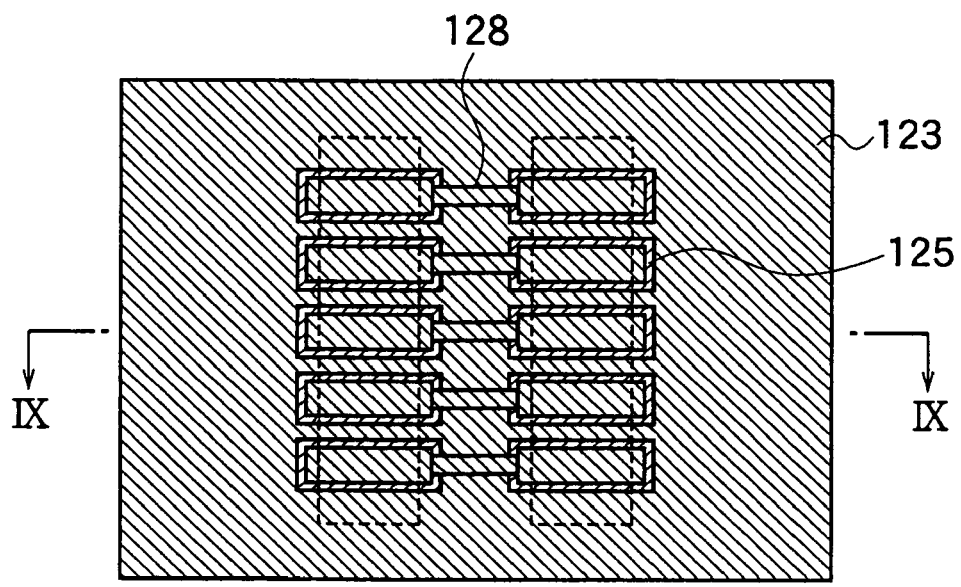
FIG. 23 is a top view where RIE is performed to the polysilicon film 124.

FIG. 23 is a top view where RIE is performed to the polysilicon film 124. In this process, the polysilicon film of the gate electrode is processed by RIE using the resist pattern made up of the SiN 125 and contact regions. Thus, a configuration as shown in the drawing is obtained.

Figure 24:
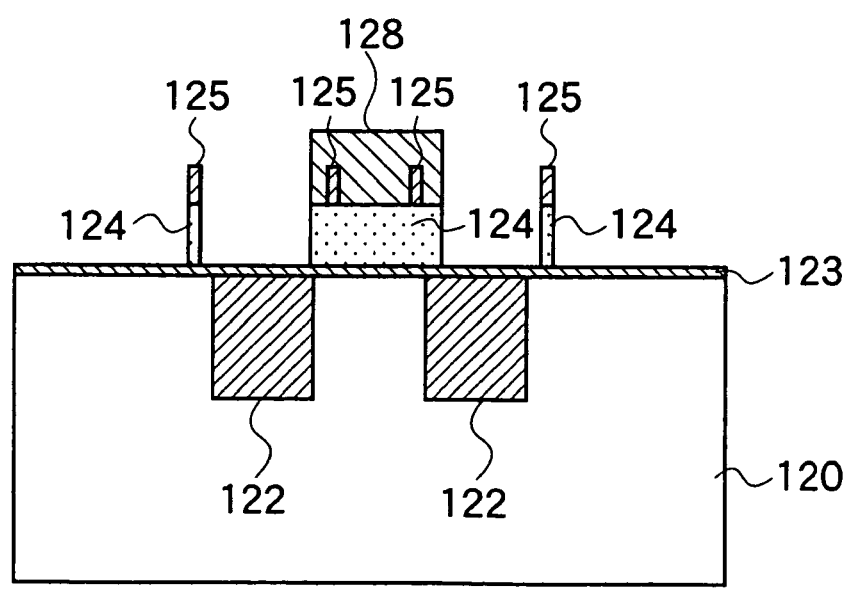
FIG. 24 is a view showing a cross-section in a IX-IX section of FIG. 23.

FIG. 24 is a view showing a cross-section in a IX-IX section of FIG. 23. Here, the SiN 125 to serve as the hard masks and the resist region 128 are used as a mask to process the polysilicon region 124 by RIE, and thus a configuration as shown in the drawing is obtained.

Figure 25:
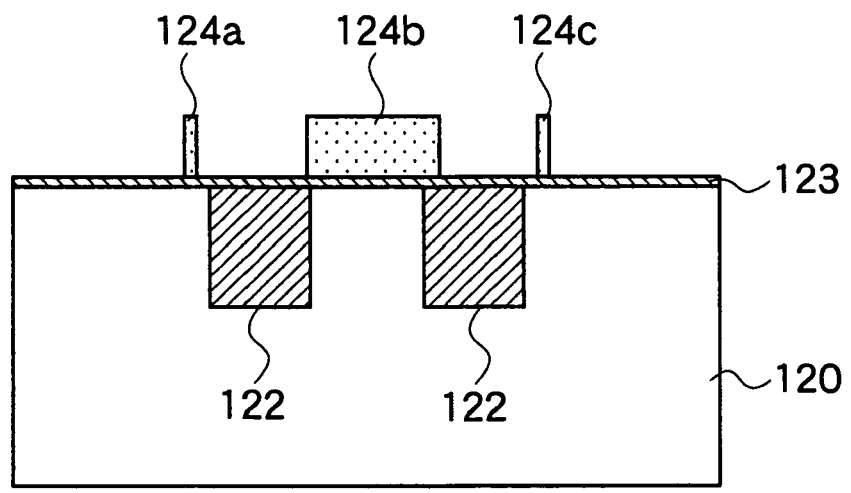
FIG. 25 is a view where the resist region is removed from the cross-section in the IX-IX section of FIG. 23.

FIG. 25 is a view where the resist region is removed from the cross-section in the IX-IX section of FIG. 23. Here, the SiN and the resist region are removed from the top surface of the polysilicon film. Thus, a sectional configuration as shown in the drawing is formed. It goes without saying that, on other cross-sections, the polysilicon film exists on the device regions 122 with the gate insulator interposed therebetween.

Figure 26:
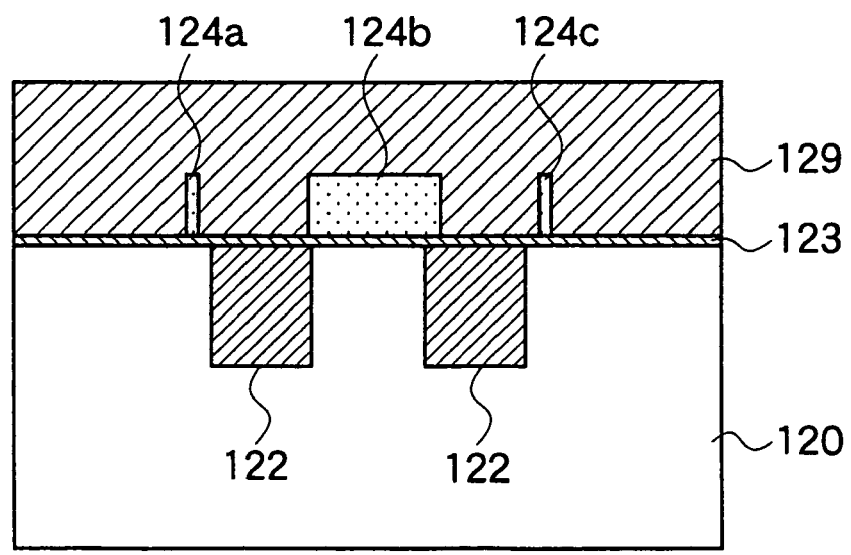
FIG. 26 is a view showing a cross-section in a IX-IX section of FIG. 23.

FIG. 26 is a view showing a cross-section in a IX-IX section of FIG. 23. As shown in the drawing, an interlayer dielectric 129 is formed after ordinary manufacturing processes of a MOSFET (ion implantation into an S/D extension, gate sidewall forming, ion implantation into an S/D region, activation, salicide process and the like) are performed subsequent to the above processes.

Figure 27:
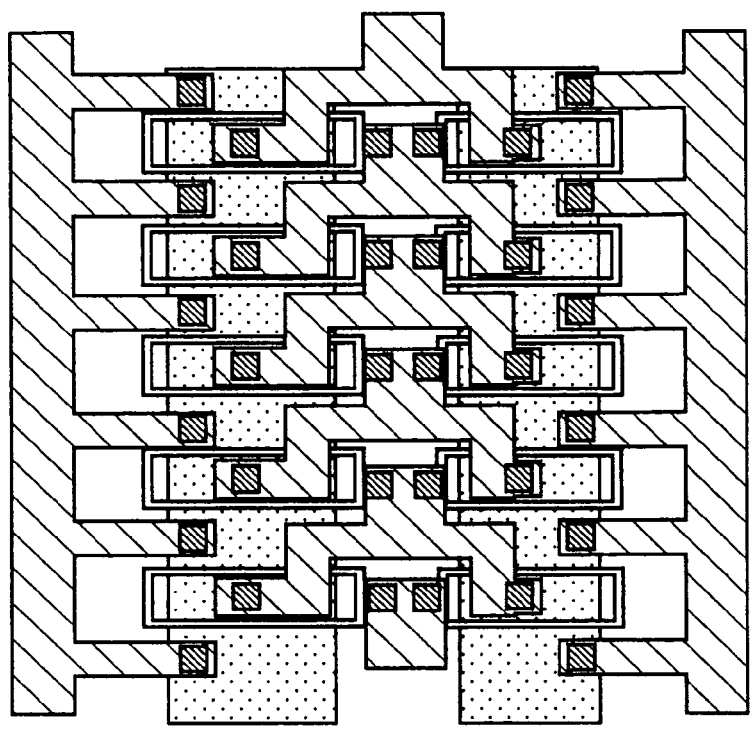
FIG. 27 shows an example of layout of an inverter chains according to an embodiment.
Figure 28:
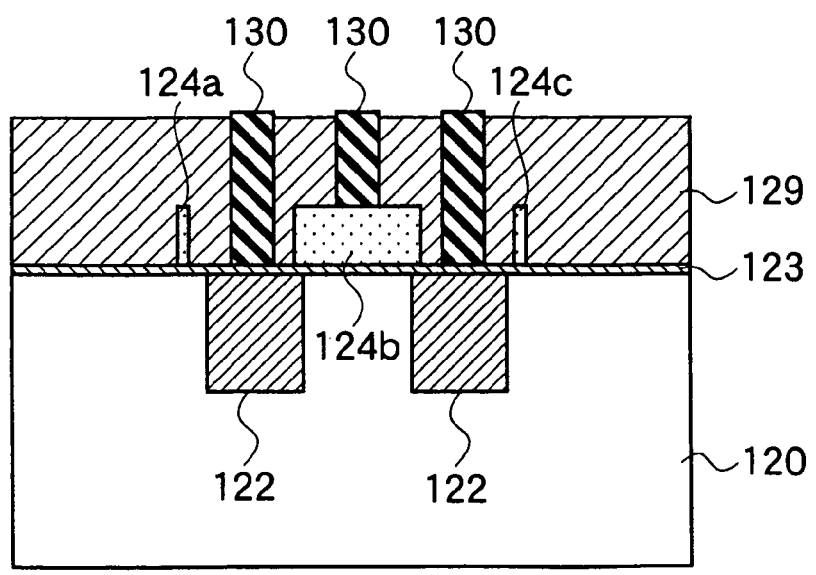
FIG. 28 is a sectional view where the contact regions and the wiring regions 130 are provided in the section of FIG. 26.

After wiring the metal wirings as shown in FIG. 27, inverter chains are finally formed in this case. FIG. 28 is a sectional view where the contact regions and the wiring regions 130 are provided in the section of FIG. 26. Here, the contact regions and the wiring regions 130 for electrical connection are provided to the polysilicon film 124b in the interlayer dielectric 129 and to the silicon nitride films 122.

In this embodiment, silicon nitride, TEOS and amorphous silicon are used as the materials for the hard mask material 125, the dummy pattern 126 and the sidewall material 127, respectively. However, the materials are not limited to this combination. For example, the combination of the materials for the hard mask material 125, dummy pattern 126 and sidewall material 127 may be silicon nitride-TEOS-amorphous silicon, silicon nitride-TEOS-amorphous silicon germanium, TEOS-amorphous silicon germanium-silicon nitride or the like.

The manufacturing process is not limited to the above method, and the order of some of the processes can be changed. In addition, here, the semiconductor device is limited to the one having a simple rectangular device region. However, the semiconductor device can be formed by a similar process even when the device region has a device form including a plurality of Fins.

Thus, according to the manufacturing method of the semiconductor device of the present embodiment, the loop gate electrode region is formed by the sidewall pattern transfer method. Therefore, when the area of the drain region is the same as that of the conventional type, the electric current to drive the drain junction capacitance is twice as large as that of the conventional MOSFET. Thus, switching delay time can be improved. Moreover, the mechanical strength can be increased by making the gate into a loop shape. Accordingly, it is possible to prevent the pattern of the ultra-fine gate region 101 from falling down. Moreover, since the two gate electrodes are connected in parallel, parasitic resistance of the gate electrode can be reduced. Furthermore, by employing the loop gate electrode, a MOSFET suitable to a gate electrode forming process adopting the sidewall pattern transfer method can be achieved.

As described above, according to the semiconductor device and the manufacturing method of the same of the present invention, it is possible to provide a semiconductor device and a manufacturing method of the same where a logic circuit can be formed even when a fine gate forming process adopting the sidewall pattern transfer method is employed.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device, comprising:
   a first device region including a plurality of source regions and a plurality of drain regions of first conductivity type transistors;
   a plurality of loop-shaped gate electrode regions of the first conductivity type transistors, each of the gate electrode regions formed on the first device region;
   a second device region including a plurality of source regions and a plurality of drain regions of a second conductivity type transistors;
   a plurality of loop-shaped gate electrode regions of the second conductivity type transistors, each of the gate electrode regions formed on the second device region and electrically coupled to each of the gate electrode regions of the first conductivity type transistors;
   a first wiring configured to supply a first voltage to at least one of the source regions of the first device region;
   a second wiring configured to supply a second voltage to at least one of the source regions of the second device region; and
   a third wiring electrically coupled to the drain regions of the first and second device regions and to the gate electrode regions of the first and the second conductivity type transistors;
   wherein the plurality of the loop-shaped gate electrode regions of the first conductivity type transistors are arranged to surround a part of the first device region and at least one device isolation region, and
   wherein the plurality of the loop-shaped gate electrode regions of the second conductivity type transistors are arranged to surround a part of the second device region and at least one device isolation region.

2. The semiconductor device of claim 1, wherein the gate electrode regions of the first and the second conductivity type transistors are coupled by a wiring.

3. The semiconductor device of claim 1, wherein the gate electrode regions of the first and second conductivity type transistors are coupled by a region made of a material to form the gate electrode regions.

4. The semiconductor device of claim 1, wherein a shape of the gate electrode region of the first conductivity type transistor is different from that of the gate electrode region of the second conductivity type transistor.

5. The semiconductor device of claim 1, wherein a shape of the first device region is different from that of the second device region.

6. The semiconductor device of claim 1, wherein a channel region of the first or the second conductivity type transistor is formed in a plane perpendicular to a substrate surface.

7. The semiconductor device of claim 6, wherein a direction of an electric current flowing through the channel region of the first or second conductivity type transistor is horizontal to the substrate surface.

8. The semiconductor device of claim 1, wherein the first or the second device region includes a fin structure including a plurality of rectangular strips.

9. The semiconductor device of claim 8, wherein, in the semiconductor device, a plurality of channel regions are formed in perpendicular to a substrate surface, a direction of an electric current is horizontal to the substrate surface, and the channel regions are completely depleted during operation.

10. The semiconductor device of claim 9, wherein a ratio of a number of fins of the channel of an n-type transistor to a number of fins of the channel of a p-type transistor of the semiconductor device is 1.0 or more and 2.0 or less.

* * * * *